March 20, 1962 C. G. DAVIS 3,026,511

SLOW READOUT PCM ENCODER

Filed Oct. 2, 1959 2 Sheets-Sheet 1

INVENTOR
C. G. DAVIS
BY R. B. Ardis
ATTORNEY

March 20, 1962 | C. G. DAVIS | 3,026,511

SLOW READOUT PCM ENCODER

Filed Oct. 2, 1959 | 2 Sheets-Sheet 2

INVENTOR
C. G. DAVIS
BY R. B. Ardis
ATTORNEY

3,026,511
SLOW READOUT PCM ENCODER

Claude G. Davis, Morristown, N.J., assignor to Bell Telephone Laboratories, Incorporated, New York, N.Y., a corporation of New York Filed Oct. 2, 1959, Ser. No. 844,075
4 Claims. (Cl. 340—347)

This invention relates to encoders for pulse systems and more particularly to encoders for use in the transmitters of communication systems employing pulse code modulation.

In pulse code modulation communication systems, a speech wave or other signal to be transmitted is sampled periodically to ascertain its instantaneous amplitude. The measured instantaneous amplitudes (PAM signals) are then transformed by an encoder into pulse code form. The proper functioning of an encoder is dependent upon both the PAM sample voltage remaining constant during the period of encoding and disappearing before the next sample appears. The former requires good low frequency response; the latter good high frequency response. This results in wide bandwidth requirements for the sampling gates and to avoid these wide bandwidth requirements earlier PCM systems used two buses and a transfer gate preceding the encoder. The PAM samples were alternately applied to each bus and the transfer gate connected the encoder to the proper bus. This approach allowed time for the discharge of one bus while a sample on the other was being encoded, and vice versa, thus reducing the bandwidth requirements for the sampling gates.

Because the transfer gate switched between analog signals, the problems of crosstalk and the successful introduction of a D.-C. bias (to produce unipolar pulses from the analog signals) at the transfer gate were present. Energy stored in the transfer gate produces crosstalk from the $n$th sample into the $(n+1)$th sample. Elimination of this crosstalk in the above-described system would require expensive and complicated transfer gates and drive circuitry. Transfer gates adequate to perform the switching function without introducing crosstalk may even be equal in cost to a complete encoder.

One object of the invention is to avoid the necessity for two input buses and a transfer gate to precede the input of a PCM encoder.

A related object of the invention is to avoid wide bandwidth requirements for the sampling apparatus in a single input bus PCM encoder in as simple and inexpensive a manner as possible.

Still another object of the invention is to reduce the bandwidth requirements of the sampling apparatus of a PCM encoder without introducing undesirable interchannel crosstalk.

Still another object of the invention is to avoid any necessity for highly complex and expensive transfer gate circuits in a multichannel PCM encoder.

This invention employs encoding apparatus which operates at a speed greater than that required by the encoding system, but in which the output is stored by the encoder and read-out at the speed required by the encoding system. In this manner the length of time that the sample need be applied to the encoder is reduced, and the length of time between successive samples is increased. Increasing the time between successive samples eliminates the need for the customary odd and even input channels and their associated circuitry since each sample now has sufficient time to be removed from a single input channel before the application of the next sample.

The invention will be more fully comprehended from the following detailed description taken in conjunction with the drawings, in which.

Figure 1:
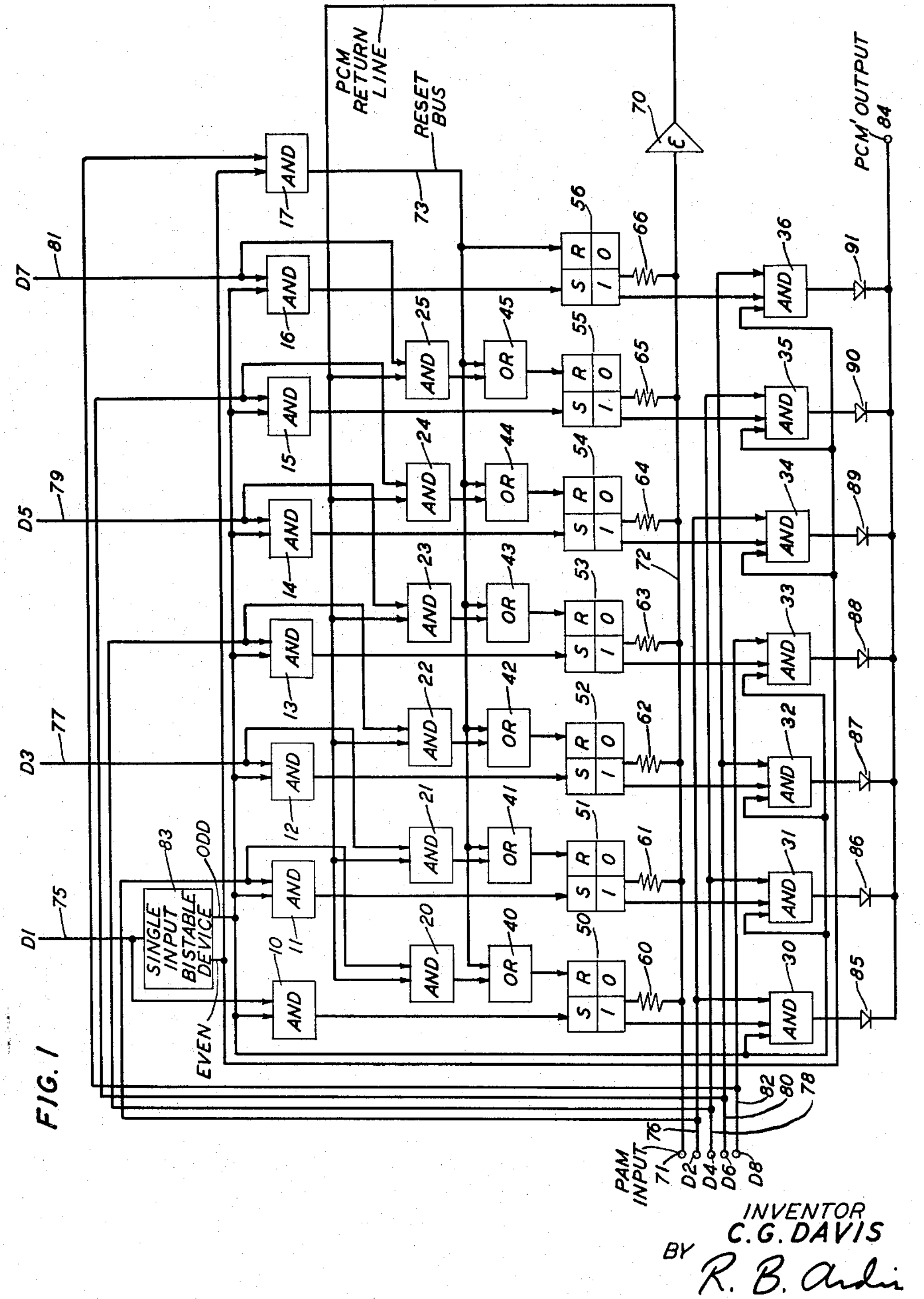
FIG. 1 is a block diagram of a seven-digit encoder embodying the invention.

Although the symbolic diagrams employed in the drawings are fairly conventional they will first be described briefly. An AND gate, such as any one of the AND gates 10 through 17, 20 through 25, or 30 through 36, has a plurality of input leads but produces an output only when all input leads are simultaneously enabled. An OR gate, such as any one of the OR gates 40 through 45, has a plurality of input leads but produces an output when any one or more of its input leads is enabled.

Bistable devices 50 through 56 and weighting resistors 60 through 66 comprise the coding circuit of the encoder. The appearance of a pulse at the output of AND gate 10 triggers bistable device 50 into the one of its two stable conditions wherein a reference voltage is applied to weighting resistor 60 and to one input of AND gate 30. Similarly, the appearance of an output pulse from any AND gate 11 through 16 triggers its respective bistable device 51 through 56 into the one of its two stable conditions wherein a reference voltage is applied to weighting resistors 61 through 66 respectively and AND gates 31 through 36 respectively.

The above-described operation of triggering a bistable device to generate a reference voltage is called "setting" the bistable device. The setting of a bistable device is indicated in the drawing of a bistable device by having the input line from its respective gate enter the "S" portion of the box representing the bistable device, with the weighting resistors, and connections to the AND gates being drawn to the "1" portion of the box representing the bistable device. The appearance of a pulse at the output of any one of OR gates 40 through 45 triggers its respective bistable device 50 through 55 into the one of its two stable conditions which causes a ground to be applied to weighting resistors 60 through 65. This operation is called "resetting" the bistable device and is indicated in the drawing of a bistable device by having the line by which the resetting pulse is applied enter the "R" portion of the box representing the bistable device.

Error amplifier 70 is a stable high-gain D.-C. amplifier with a low input impedance. The amplifier acts as a current summing node in that it produces an output only when current flows from the error amplifier to the weighting resistors. The output of the amplifier is constant over a great input range, since it is a very high gain amplifier and is provided with a non-linear feedback path which severely limits gain after a predetermined output level is reached.

The circuit illustrated is a sequential type seven digit binary encoder. Such an encoder performs comparisons between each applied PAM sample and a sequence or reference pulses of standard amplitude. A code output dependent on the comparisons and representative of each sample is generated by the encoder. The reference pulses are generated by seven bistable devices 50 through 56 with associated output resistors 60 through 66. The latter are weighed in binary fashion so that if resistor 60 is equal to R, then resistor 61 is equal to 2R, resistor 62 is equal to 4R, resistor 63 is equal to 8R, resistor 64 is equal to 16R, resistor 65 is equal to 32R, and resistor 66 is equal to 64R.

The PAM samples are applied to the input channel 71 of the encoder. An output pulse from AND gate 10 is applied to bistable device 50 causing it to set. Resistor 60 draws 64 units of current. If the input sample exceeds 64 units then current flows through conductor 72 to error amplifier 70. Error amplifier 70 generates no output when current flows into it and bistable device 50 will remain set. If the input sample is less than 64 units of current then current flows from error amplifier 70 to resistor 60. When current flows from error amplifier 70 through resistor 60 error amplifier 70 produces an output, which is used to reset bistable device 50. Thus, if the PAM sample exceeds 64 units bistable device 50 remains in its set position, but if the sample is less than 64 units bistable device 50 is reset to its zero position.

Following the above-described operation an output pulse from AND gate 11 sets bistable device 51. Resistor 61 draws 32 units of current. If bistable device 50 is still in its set position the pulse sample must be greater than 64+32 units in order for current to flow into the error amplifier 70. If the sample is less than 64+32 units, current flows from error amplifier 70 into resistor 61. If current flows into error amplifier 70 no output is generated and bistable device 51 remains in its set position. If, however, current flows out of error amplifier 70 there is an output from the error amplifier which is used to reset bistable device 51. If bistable device 50 was reset, the pulse sample must be greater than 32 units in order for current to flow into the error amplifier 70. If the sample is less than 32 units, current flows from error amplifier 70. If current flows into error amplifier 70 no output is generated and bistable device 51 remains set. If, however, current flows out of error amplifier 70 then there is an output from the error amplifier which causes the bistable device 51 to be reset.

Following the above-described operation, further comparisons are made until the seven digit output is completed, at which time the PAM sample is removed and the circuit readied, by the application of a pulse to reset bus 73 by AND gate 17, for a new sample and a new sequence of comparisons.

As thus far described, the operation is that of a conventional seven-digit encoder. The purpose of such an encoder is to convert a PAM sample into a code of marks and spaces occupying seven time slots, with an eighth time slot separating the code for consecutive samples. Each mark or space of the code occupies a time slot whose width is determined by the system bit rate. During each of the first seven time slots of the encoding cycle the conventional seven-digit encoder generates a reference pulse, compares the reference pulse to the PAM sample, and generates an output dependent on that comparison. In order to insure accurate encoding, conventional seven digit encoders require that the PAM sample remain constant during the first seven time slots so that accurate comparisons can be made, and also require that the sample disappear completely during the eighth time slot. To fulfill these requirements the sampling gates which apply the PAM samples to the encoder must have very wide bandwidths. To reduce the wide bandwidth requirement for an individual sampling gate conventional sequential encoders employ two input buses and a transfer gate preceding the input to the encoder. Unfortunately, crosstalk problems in the transfer gate require the use of expensive and complex transfer gates, and a simpler and less expensive method of avoiding the bandwidth problem was sought. This invention solves the bandwidth problem by employing encoding apparatus which encodes at a speed greater than that required by the system bit rate, but in which the output is stored in the encoder and read out of the encoder at the speed required by the system bit rate. In this manner the length of time that the PAM sample need be applied to the encoder is reduced, and the need for the customary odd and even input channels eliminated, since each sample now has sufficient time to be removed from a single input bus before the appearance of the next sample.

Figure 2:
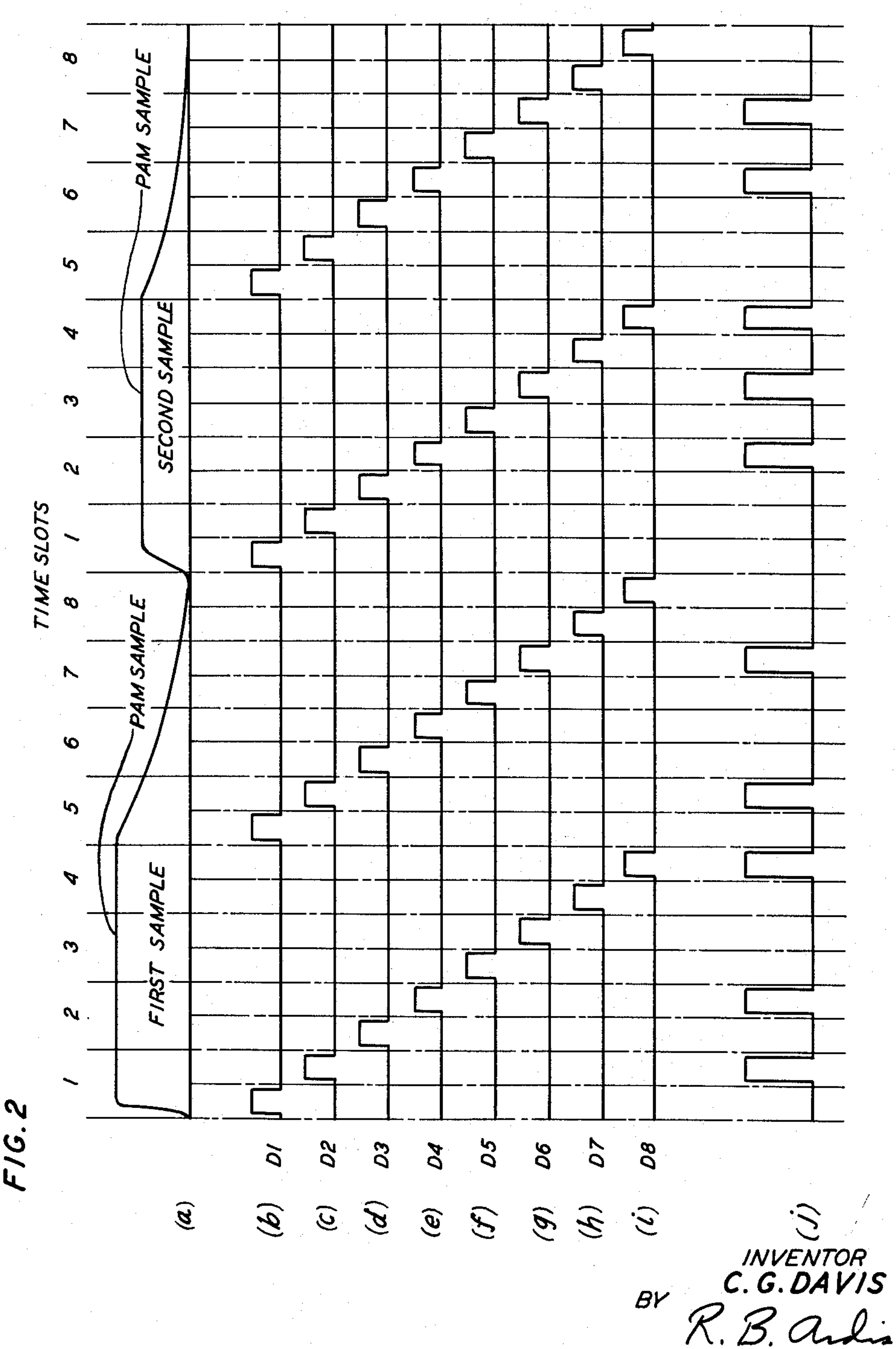
FIG. 2 is a group of wave forms useful in explaining the operation of the invention.

A seven-digit encoder embodying the invention is shown in FIG. 1. In the specific embodiment shown in FIG. 1 the PAM samples, shown with relation to the time slots of the encoding system in line (*a*) of FIG. 2, need be applied to the input of the encoder only during the first four time slots of the encoding cycle. A code output for the PAM samples is shown in relation to the time slots of the encoding cycle in line (*j*) of FIG. 2. To control the sequential operation of the encoding stages and the read out from the encoder, digit control pulses D1 through D8, shown in lines (*b*) through (*i*) of FIG. 2, are applied to input lines 75 through 82 respectively. Digit control pulse D1 appears during the first half of the first time slot; digit control pulse D2 is present during the second half of the first time slot. Similarly, in the second time slot control pulses D3 and D4 are present during the first and second halves of that time slot respectively; during the third time slot control pulses D5 and D6 are present during the first and second halves of that time slot respectively; and during the fourth time slot the seventh and eighth digit control pulses, D7 and D8, are present during the first and second halves of that time slot respectively. During the fifth, sixth, seventh, and eighth time slots of the encoding cycle the digit control pulses appear again in the same order as during the first four time slots.

In the specific embodiment of the invention shown in FIG. 1, the PAM sample is applied to the input channel 71 of the encoder only during the first four time slots, and may be removed during the remaining four time slots of the encoding cycle of eight time slots. The appearance and decay of two PAM samples is shown in line (*a*) of FIG. 2 and it is important to note that a PAM sample need be present and held constant only during the first four time slots of the encoding cycle for proper encoding to take place. Conventional sequential encoders require the PAM sample to be present and held constant during the first seven time slots of the encoding cycle, and also require that the sample disappear entirely during the eighth time slot. In the specific embodiment of the invention, therefore, the time for the decay of the PAM sample is increased from one time slot to four time slots. Digit control pulse D1 appearing on input line 75 sets single input bistable device 83 so that an output voltage appears at its odd output terminal. No output voltage appears at its even output terminal. The simultaneous occurrence of the odd output of bistable device 83 and digit control pulse D1 actuates AND gate 10, whose output sets bistable device 50. As before described, if the input sample is greater than 64 units bistable device 50 remains set during the remainder of the encoding cycle. If, however, the input sample is less than 64 units then the output of error amplifier 70 combines, at the beginning of the second half of the first time slot, with digit control pulse D2 to produce an output from AND gate 20 which when applied to OR gate 40 resets bistable device 50.

During the beginning of the second half of the first time slot digit control pulse D2 combines with the odd output of bistable device 83 to actuate AND gate 11 thus setting bistable device 51. If the input sample is such that the error amplifier 70 does not generate an output then bistable device 51 remains set for the remainder of the encoding cycle. If, however, the input sample is of such magnitude that error amplifier 70 generates an output then digit control pulse D3 and the output of the error amplifier 70 will combine to actuate AND gate 21 so that OR gate 41 resets bistable device 51.

The above-described process continues with each bistable device 52 through 56 being initially set during the first four time slots of the encoding cycle by the occurrence of digit control pulses D3 through D7 respectively. At the end of the first four time slots of the encoding cycle bistable devices 50 through 56 will be in either of their two stages. The output of each bistable device will be either a reference voltage or a ground voltage. The states of the bistable devices are determined by the magnitude of the PAM sample and constitute a binary representation of the sample. In order for the encoder to function properly, the states of the bistable devices 50 through 56 must be made to appear at the PCM' output terminal 84 during the first through seventh time slots respectively.

The state of bistable device 50 is made to appear at the PCM' output terminal 84 during the first time slot by the simultaneous occurrence at AND gate 30 of digit control pulse D2 and the odd output of bistable device D3. Since digit control pulse D2 and the odd output of bistable device 83 appear simultaneously only during the second half of the first time slot, AND gate 30 can be actuated only at that time. During the second half of the second time slot the simultaneous occurrence of digit control pulse D4 and the odd output of bistable device 83 actuates AND gate 31 so that the output of bistable device 51 is applied to PCM' output terminal 84. In a similar manner the actuation of AND gates 32 and 33 during the third and fourth time slots respectively applies the outputs of bistable devices 52 and 53 respectively to the PCM' output terminal 84.

From the above description it is apparent that during the first four time slots of the encoding cycle bistable devices 50 through 56 have assumed states which constitute a binary representation of the PAM sample, and that the outputs of the first four bistable devices 50 through 53 have been read out by means of the action of AND gates 30 through 33 respectively. During the fifth, sixth, and seventh time slots of the encoding cycle the outputs of bistable devices 54, 55, and 56 are read out in a similar manner by the action of AND gates 34, 35, and 36 respectively. These AND gates are rendered operative during these time slots by the appearance of an output voltage at the even output terminal of bistable device 83 which has been triggered to change states by the appearance of digit control pulse D1 during the first half of the fifth time slot of the encoding cycle. For example, AND gate 34 is actuated during the second half of the fifth time slot by the simultaneous occurrence of an output at the even output terminal of bistable device 83 and control pulse D2. The presence at the output of each AND gate 30 through 36 of a diode 85 through 91 respectively, prevents the output from any AND gate from being applied to the other AND gate.

During the fifth, sixth, and seventh time slots no encoding takes place since each AND gate 10 through 16 is rendered inoperative at that time by the absence of an output voltage at the odd terminal of bistable device 83. Similarly, AND gates 30 through 33 are rendered inoperative during the fifth, sixth, and seventh time slots. During the last half of the eighth time slot digit control pulse D8 in conjunction with the even output of bistable device 83 actuates AND gate 17 whose output is applied to OR gates 40 through 45 which reset all bistable devices 50 through 56.

The encoding of the next input sample is accomplished in the same manner as described above. It should be noted, however, as shown in line (*a*) of FIG. 2, that a period of four time slots is available between input samples for the preceding input sample to disappear from the input channel 71 of the encoder. In conventional sequential encoders only one time slot is allowed for the disappearance of the preceding input sample. This invention, therefore, by encoding faster than required by the system bit rate, storing the output in the encoder, and reading the output out at the system bit rate lessens the bandwidth requirements of the sampling gates which apply the input samples to the encoder. This invention, therefore, avoids the necessity for odd and even input channels and greatly reduces the cost of the resulting encoding apparatus.

The output appearing at PCM' terminal 84 is the inverse of the usual binary code. That is to say, if the sample is sufficient in amplitude to cause current to flow into the error amplifier 70 no output pulse is produced; if the error amplifier must supply current to the weighting resistors an output pulse is produced. This output contains all the information contained in the usual binary code and may be transmitted without the necessity of conversion to the usual binary code.

It is to be understood that the above-described arrangements are illustrative of the application of the invention. Numerous other arrangements may be devised by those skilled in the art without departing from the spirit and scope of the invention.

What is claimed is:

1. In a PCM encoder for transforming a signal amplitude sample into a code group of marks and spaces occupying $n$ successive time slots, means for applying said signal amplitude sample to said encoder for a period of time less than $n$ time slots, a series of $n$ encoding stages for determining and storing the code group for said signal amplitude sample during said period of time, and means for reading out the stored code group from said encoding stages so that a mark or space of the code group appears in each time slot of said $n$ time slots.

2. In a PCM encoder for transforming a signal amplitude sample into a code group of marks and spaces occupying $n$ successive time slots, means for applying said signal amplitude sample to said encoder for a period of time less than $n$ time slots, a series of $n$ encoding stages each comprising means to generate a reference pulse of standard amplitude, means to sequentially compare the amplitudes of said reference pulses with said signal amplitude sample during said period of time, means to store in each encoding stage an output dependent on the comparison between said signal amplitude sample and the reference pulse output of the encoding stage, and means for reading out the stored code group from said encoding stages so that a mark or space of the code group appears in each time slot of said $n$ time slots.

3. In a PCM encoder for transforming a signal amplitude sample into a code group of marks and spaces occupying $n$ successive time slots, means for applying said signal amplitude sample to said encoder for the first $n/2$ of said $n$ time slots, a series of $n$ encoding stages for determining and storing the code group for said signal amplitude sample during said first $n/2$ time slots, and means for reading out the stored code group from said encoding stages so that a mark or space of the code group appears in each time slot of said $n$ time slots.

4. In a PCM encoder for transforming a signal amplitude sample into a code group of marks and spaces occupying $n$ successive time slots, means for applying said signal amplitude sample to said encoder for the first $n/2$ of said $n$ time slots, a series of $n$ encoding stages each comprising means to generate a reference pulse of standard amplitude, means to sequentially compare the amplitudes of said reference pulses with said signal amplitude sample during said first $n/2$ time slots, means to store in each encoding stage an output dependent on the comparison between said signal amplitude sample and the reference pulse output of the encoding stage, and means for reading out the stored code group from said encoding stages so that a mark or space of the code group appears in each time slot of said $n$ time slots.

References Cited in the file of this patent

UNITED STATES PATENTS

| | | |
|---|---|---|
| 2,549,422 | Carbrey | Apr. 17, 1951 |
| 2,610,295 | Carbrey | Sept. 9, 1952 |
| 2,754,503 | Forbes | July 10, 1956 |